United States Patent
Ide et al.

(10) Patent No.: US 8,552,444 B2
(45) Date of Patent: Oct. 8, 2013

(54) SEMICONDUCTOR LIGHT-EMITTING DEVICE AND MANUFACTURING METHOD OF THE SAME

(75) Inventors: Yoshiyuki Ide, Kagoshima (JP);
Hidenori Kamei, Kagoshima (JP);
Isamu Yonekura, Kagoshima (JP);
Kunihiko Obara, Kagoshima (JP);
Koichi Nakahara, Kagoshima (JP);
Kouji Nakatsu, Kagoshima (JP);
Yoshirou Tooya, Kagoshima (JP);
Toshirou Kitazono, Kagoshima (JP);
Toshihide Maeda, Kagoshima (JP);
Kenichi Koya, Kagoshima (JP);
Takahiro Shirahata, Hyogo (JP)

(73) Assignee: Panasonic Corporation, Osaka (JP)

( * ) Notice: Subject to any disclaimer, the term of this patent is extended or adjusted under 35 U.S.C. 154(b) by 132 days.

(21) Appl. No.: 12/743,330

(22) PCT Filed: Nov. 13, 2008

(86) PCT No.: PCT/JP2008/003308
§ 371 (c)(1),
(2), (4) Date: May 17, 2010

(87) PCT Pub. No.: WO2009/066430
PCT Pub. Date: May 28, 2009

(65) Prior Publication Data
US 2010/0258830 A1     Oct. 14, 2010

(30) Foreign Application Priority Data
Nov. 19, 2007   (JP) ................................. 2007-299022

(51) Int. Cl.
*H01L 29/72*     (2006.01)

(52) U.S. Cl.
USPC ............................. 257/98; 313/512; 348/294

(58) Field of Classification Search
USPC ............................. 257/98; 313/512; 348/294
See application file for complete search history.

(56) References Cited

U.S. PATENT DOCUMENTS

| | | | |
|---|---|---|---|
| 2002/0187570 A1 | 12/2002 | Fukasawa et al. | |
| 2003/0151361 A1* | 8/2003 | Ishizaka | 313/512 |
| 2006/0284207 A1 | 12/2006 | Park et al. | |
| 2007/0064131 A1* | 3/2007 | Sawanobori et al. | 348/294 |
| 2009/0032832 A1* | 2/2009 | Lin et al. | 257/98 |

FOREIGN PATENT DOCUMENTS

| | | |
|---|---|---|
| JP | 06-268252 | 9/1994 |
| JP | 10-151794 A | 6/1998 |

(Continued)

*Primary Examiner* — Edward Wojciechowicz
(74) *Attorney, Agent, or Firm* — McDermott Will & Emery LLP

(57) ABSTRACT

Light from a semiconductor light-emitting element travels in all directions. Thus, light that travels in the directions other than a lighting direction cannot be used effectively. Means for forming a semiconductor light-emitting element having tilted side surfaces, and forming a reflective layer on the tilted side surfaces has been proposed. However, since the tilted surfaces are formed by an etching method or the like, it takes a long time to form the tilted surfaces, and it is difficult to control the tilted surfaces. As a solution to these problems, semiconductor light-emitting elements are placed on a submount substrate and sealed with a sealant, and then a groove is formed in a portion between adjoining ones of the semiconductor light-emitting elements. The grooves formed are filled with a reflective material, and a light-emitting surface is polished. Then, the submount substrate is divided into individual semiconductor light-emitting devices. Thus, a semiconductor light-emitting device having a reflective layer on its side surfaces can be obtained.

7 Claims, 12 Drawing Sheets

(56) References Cited

FOREIGN PATENT DOCUMENTS

| | | |
|---|---|---|
| JP | 2001-196637 | 7/2001 |
| JP | 2003-046140 A | 2/2003 |
| JP | 2003-234509 | 8/2003 |
| JP | 2003-330109 | 11/2003 |
| JP | 2005-026400 | 1/2005 |
| JP | 2006-128659 | 5/2006 |
| JP | 2007-080994 | 3/2007 |

* cited by examiner

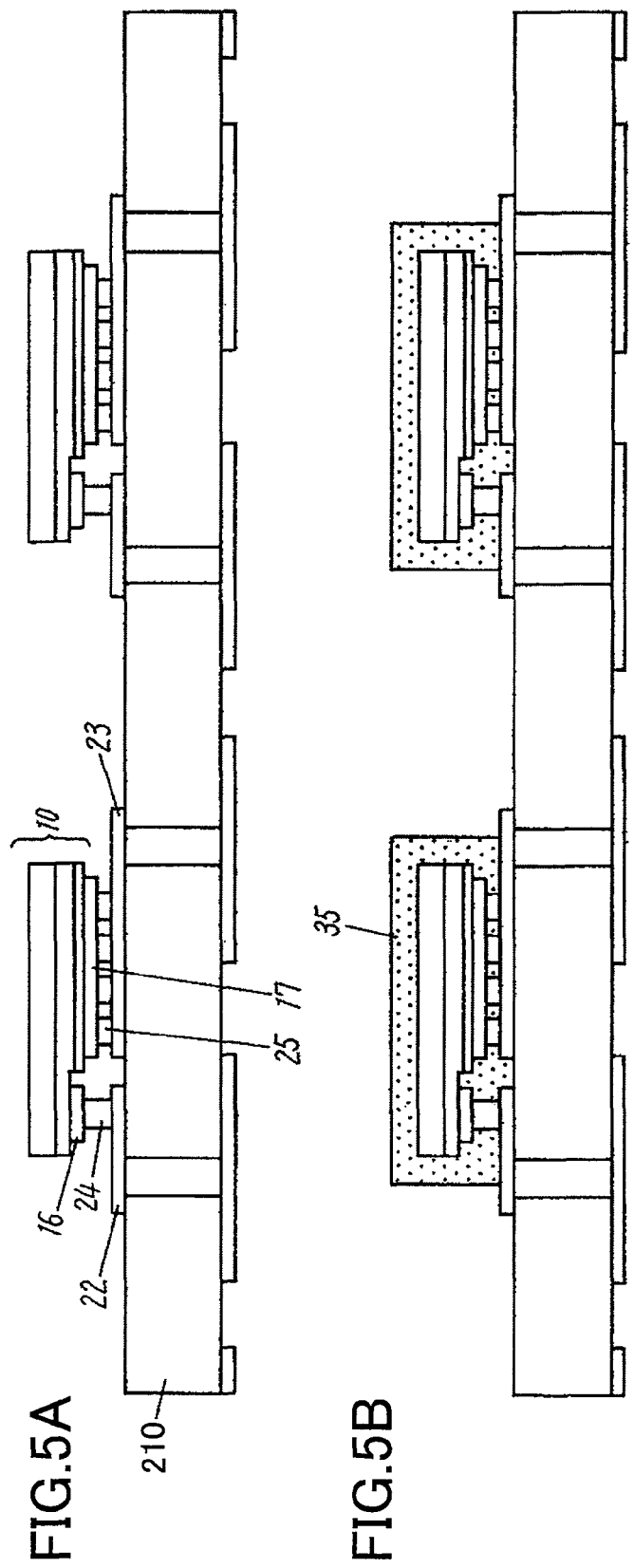

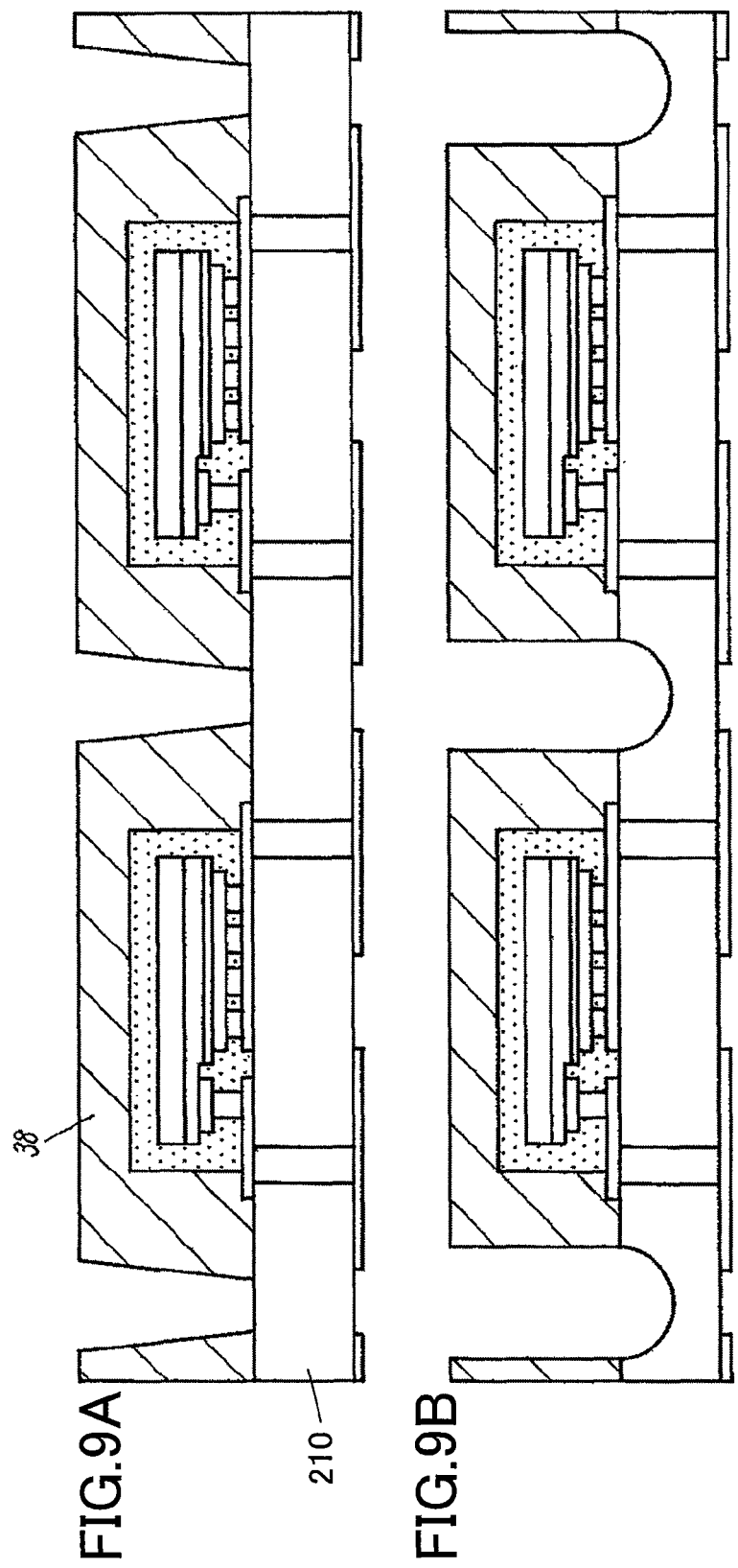

SEMICONDUCTOR LIGHT-EMITTING DEVICE AND MANUFACTURING METHOD OF THE SAME

RELATED APPLICATIONS

This application is the U.S. National Phase under 35 U.S.C. §371 of International Application No. PCT/JP2008/003308, filed on Nov. 13, 2008, which in turn claims the benefit of Japanese Application No. 2007-299022, filed on Nov. 19, 2007, the disclosures of which Applications are incorporated by reference herein.

TECHNICAL FIELD

The present invention relates to semiconductor light-emitting elements in which a reflective layer is provided on the side surfaces of a sealant in order to effectively use light that is emitted from the side surfaces of the semiconductor light-emitting element, and semiconductor light-emitting devices using the same.

BACKGROUND ART

Semiconductor light-emitting elements emit light from a light-emitting layer that is formed by p-type and n-type semiconductors having an active layer therebetween. Thus, light is emitted in all directions. However, in many applications using the semiconductor light-emitting elements as light sources, it is often desired that light be emitted in one direction. In such cases, light that travels in directions different from the radiation direction is wasted. In order to efficiently use light, it is preferable to reflect such light toward a light-emitting surface of the semiconductor light-emitting element.

As a solution to this problem, semiconductor light-emitting elements have been proposed in which the side surfaces of the semiconductor light-emitting element are tilted so that light is directed toward a light-emitting surface. For example, Patent Document 1 shows a semiconductor light-emitting element having tilted side surfaces on an electrode, and having a reflective layer on each of the tilted surfaces. In this semiconductor light-emitting element, electrodes are provided on both sides of a light-emitting layer. In order to increase light extraction efficiency from the light-emitting layer, a sapphire substrate used to form the light-emitting layer is later delaminated with laser light.

Patent Document 2 shows a semiconductor light-emitting element in which an electrode is formed on one surface of a transparent substrate, and the bottom surface opposite to a light-emitting surface has slopes so that light generated by a light-emitting layer is not incident on the electrode.

These are examples in which a reflective layer is made of a metal thin film such as a vapor deposition film. However, since forming the reflective layer by the metal thin film or the like requires processing in a vacuum chamber, these examples are not necessarily suitable for mass production.

Another approach is to direct light from the side surfaces of a light-emitting device including a lead frame and a sealant, toward a light-emitting surface, instead of providing a reflective layer on the side surfaces of a semiconductor light-emitting element itself As such an approach, Patent Document 3 proposes a semiconductor light-emitting device having a reflective frame on the side surfaces of a sealing resin that seals a semiconductor light-emitting element.

FIG. 14 is a cross-sectional view of this semiconductor light-emitting device. A semiconductor light-emitting element 92 formed on a lead frame 90 is electrically coupled to another lead frame 96 by bonding 94. The entire semiconductor light-emitting element 92 is sealed with a resin 98, and a reflective frame 100 is provided on the side surfaces of the resin 98. With this configuration, light is reflected by the side surfaces, and is extracted from a light-emitting surface of the semiconductor light-emitting device.

CITATION LIST

Patent Document

PATENT DOCUMENT 1: Japanese Published Patent Application No. 2006-128659
PATENT DOCUMENT 2: Japanese Published Patent Application No. H06-268252
PATENT DOCUMENT 3: Japanese Published Patent Application No. 2005-26400

SUMMARY OF THE INVENTION

Technical Problem

As shown in Patent Documents 1 and 2, forming a reflective layer on the side surfaces of the semiconductor light-emitting element itself requires a film formation process that is performed in a vacuum chamber. Thus, these examples are not necessarily suitable for mass production.

On the other hand, the semiconductor light-emitting device of Patent Document 3 can be fabricated by only a manufacturing process that is performed in the atmosphere. However, since the size of the semiconductor light-emitting element itself is about several hundreds of micrometers to several millimeters, the size of the reflective frame is about several millimeters. It is not easy to place the reflective frame of this size on individual semiconductor light-emitting elements.

The present invention was developed to solve the above problems, and it is an object of the present invention to provide a semiconductor light-emitting device in which a reflective layer is formed over the entire side surfaces of a sealant to improve luminous efficiency, and a manufacturing method of the same.

Solution to the Problem

In order to solve the above problems, the present invention provides a semiconductor light-emitting device including: a semiconductor light-emitting element; a submount for placing the semiconductor light-emitting element thereon; a sealant for sealing the semiconductor light-emitting element over the submount; and a reflective layer provided on a side surface of the sealant, provided that a light-emitting surface of the sealant is an upper surface.

As a method for manufacturing such a semiconductor light-emitting device, the present invention provides a method for manufacturing a semiconductor light-emitting device, including the steps of: fixing a plurality of semiconductor light-emitting elements to a submount substrate; sealing the semiconductor light-emitting elements with a sealant; filling a portion between the semiconductor light-emitting elements with a reflective material; polishing a surface of the sealant; and cutting the submount substrate along the portion filled with the reflecting material.

Advantages of the Invention

In the semiconductor light-emitting device of the present invention, the reflective layer is formed on the side surface of the sealant. Thus, light that is emitted from the semiconductor light-emitting element positioned within the sealant is reflected by a reflective surface formed by the boundary surface between the sealant and the reflective layer. This can reduce the amount of light that is emitted from the side surface of the semiconductor light-emitting device, whereby characteristics close to ideal surface emission can be obtained.

The semiconductor light-emitting device of the present invention can be fabricated by a manufacturing process that is performed in the atmosphere. Moreover, once individual semiconductor light-emitting elements are placed on the submount substrate, the sealant and the reflective layer for the individual semiconductor light-emitting elements can be formed over the submount substrate at a time. Thus, the semiconductor light-emitting device of the present invention is preferable for mass production.

BRIEF DESCRIPTION OF THE DRAWINGS

FIG. 1 is a diagram showing the configuration of a semiconductor light-emitting device of the present invention.

FIG. 2 is a diagram showing the configuration of another form of the semiconductor light-emitting device of the present invention.

FIG. 3 is a cross-sectional view of a semiconductor light-emitting element of the present invention.

FIG. 4 is a plan view of the semiconductor light-emitting element of the present invention as viewed from the light-emitting surface side.

[FIG. 5] FIGS. 5A and 5B are diagrams illustrating a manufacturing method of the semiconductor light-emitting device of the present invention.

[FIG. 6]

[FIG. 7]

FIG. 8 is a diagram of a submount substrate in the step of FIG. 7A as viewed from above.

[FIG. 9] FIGS. 9A and 9B are diagrams illustrating another manufacturing method of the semiconductor light-emitting device of the present invention.

[FIG. 10]

[FIG. 11]

FIG. 12 is a diagram showing other configuration of the semiconductor light-emitting device of the present invention.

[FIG. 13]

[FIG. ]

DESCRIPTION OF REFERENCE CHARACTERS

1 Semiconductor Light-Emitting Device
10 Semiconductor Light-Emitting Element
11 Substrate
12 n-Type Layer
13 Active Layer
14 p-Type Layer
16 n-Side Electrode
17 p-Side Electrode
20 Support Body
21 Submount
22 n-Side Extended Electrode
23 p-Side Extended Electrode
24 n-Side Bump
25 p-Side Bump
26, 27 Through Hole
35 Phosphor Layer
36 Light-Emitting Surface
38 Sealant
40 Reflective Layer
43 Reflective Material
50 Groove
57 Antireflection-Treated Light-Emitting Surface
210 Submount Substrate Description of Embodiments (First Embodiment)

Figure 1:
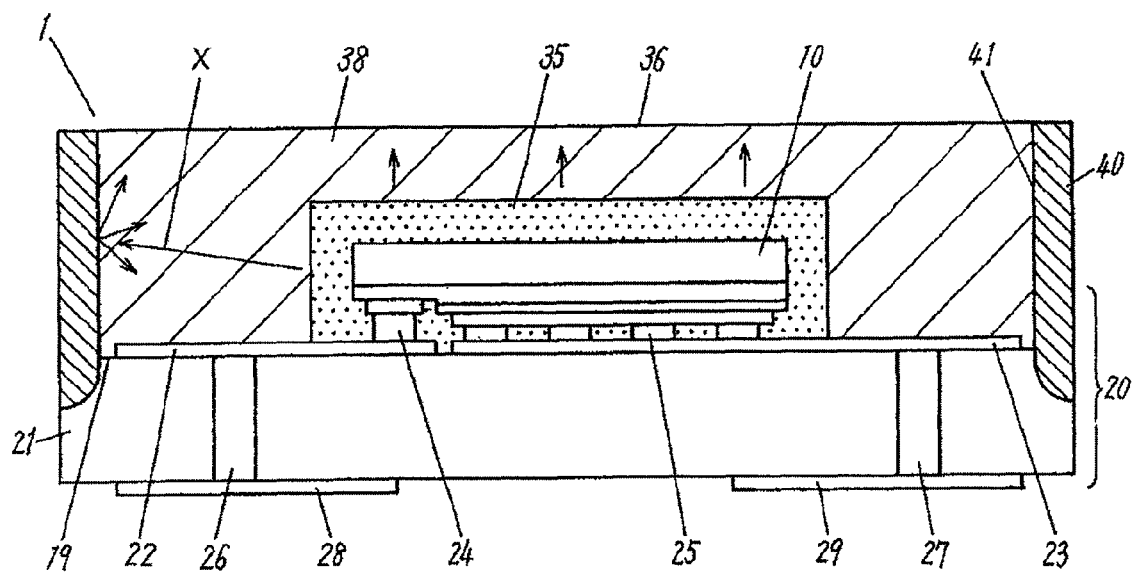
[FIG. 1]

FIG. 1 shows a semiconductor light-emitting device 1 of the present invention. The semiconductor light-emitting device 1 is structured so that a semiconductor light-emitting element 10 is fixed to a submount 21.

Although an example using a flip-chip type semiconductor light-emitting element will be described below, the semiconductor light-emitting device of the present invention does not depend on the type of semiconductor light-emitting element. That is, other types of semiconductor light-emitting elements, such as a face-up type, a one-sided electrode type, and a double-sided electrode type, can be used in the present invention.

Extended electrodes 22, 23 are formed on the submount 21. The extended electrodes are electrodes for supplying a current to the semiconductor light-emitting element 10. The extended electrode 22 is an n-side extended electrode connected to an n-type layer of the semiconductor light-emitting element, and the extended electrode 23 is a p-side extended electrode connected to a p-type layer of the semiconductor light-emitting element. In FIG. 1, the extended electrodes are also connected to back electrodes 28, 29 via through holes 26, 27. This enables a current to be supplied from the back electrodes 28, 29 to the semiconductor light-emitting element. Note that the back electrode 28 is an n-side back electrode, and the back electrode 29 is a p-side back electrode.

Bumps 24, 25 are formed on the extended electrodes. Like the extended electrodes, the bump 24 is an n-side bump connected to the n-type layer, and the bumps 25 are p-side bumps connected to the p-side layer. There are a plurality of p-side bumps in FIG. 1, and these p-side bumps are collectively represented by reference character 25. It should be noted that there may be a plurality of n-side bumps.

The extended electrodes and the semiconductor light-emitting element are directly connected together by the bumps. Thus, the bumps serve as interconnect lines. The submount, the extended electrodes, the back electrodes, the through holes, and the bumps are collectively referred to as a support body 20. Note that, depending on the embodiment, the back electrodes, the through holes, and the bumps may be omitted from the support body 20.

A phosphor layer 35 may be provided around the semiconductor light-emitting element 10. The phosphor layer 35 has one or more kinds of phosphors dispersed therein. The phosphor layer 35 emits light from the semiconductor light-emitting element 10 after converting the wavelength thereof. This enables the semiconductor light-emitting device 1 to emit light of various hues.

A transparent sealant 38 is provided around the fluorescent material layer 35. The sealant 38 is made of a medium, or a medium having a functional material dispersed therein. The sealant covers the semiconductor light-emitting element to protect the semiconductor light-emitting device 1. A resin mainly containing a silicone resin, a resin mainly containing an epoxy resin, or a resin mainly containing a fluororesin can be used as the medium of the sealant. In particular, a siloxane resin, a polyolefin, a silicone-epoxy hybrid resin, or the like is preferred as the silicone resin.

Instead of the resins, a glass material that is produced by a sol-gel method can be used as the medium of the sealant. Specifically, the glass material is a compound represented by the general formula $Si(X)_n(R)_{4-n}(n=1-3)$, where R is an alkyl group, and X is selected from halogens (Cl, F, Br, I), a hydroxyl group (—OH), and an alkoxy group (—OR). A functional material and/or an alkoxide represented by the general formula $M(OR)_n$ can be added to the glass material. Adding such an alkoxide can change the refractive index of the sealant itself.

Some of such glass materials have a hardening temperature of about 200° C., and thus can be said to be preferred materials even in view of the heat resistance of materials that are used for the bumps and the parts of the electrodes.

The functional material that is dispersed in the medium is not specifically limited. However, since the sealant is present between the semiconductor light-emitting element and a light-emitting surface of the sealant, such a material and a size that reduce the light transmittance are not suitable for the sealant 38. A preferred example is a sealant having fine silicon oxide particles as the functional material dispersed in the medium. With this sealant, light emitted from the semiconductor light-emitting element can be uniformly diffused within the sealant, and thus can be uniformly emitted from the light-emitting surface of the sealant as surface emission.

The surface of the sealant serves as a light-emitting surface 36 of the semiconductor light-emitting device 1. Surface emission can be implemented by making the light-emitting surface 36 flat. However, because of the refractive index between the sealant 38 and the atmosphere, the light-emitting surface 36 having a perfect mirror surface can reduce light extraction efficiency of the semiconductor light-emitting device due to total reflection. Thus, a fine concavo-convex structure can be provided on the light-emitting surface 36.

In the semiconductor light-emitting device of the present invention, a reflective layer 40 is further provided on the side surfaces of the sealant. The reflective layer 40 makes it difficult for light, which is emitted from the semiconductor light-emitting element 10 and travels toward the side surfaces, to be emitted from the side surfaces. Thus, the reflective layer 40 does not have to be a specular reflection layer.

For example, a medium having fine particles dispersed therein may be used as the reflective layer so that light X incident on the reflective layer 40 is scattered.

A resin, glass, or the like can be preferably used as the medium of the reflective layers 40. Specifically, any of the materials shown above as the medium of the sealant can be used as the medium of the reflective layer 40.

Fine metal oxide particles such as titanium oxide or aluminum oxide, fine metal particles such as gold, silver, or nickel, or fine white resin particles such as Teflon (Registered Trademark) can be preferably used as the fine particles.

Titanium oxide is especially preferable as it can increase the reflectance of the reflective layer. High reflectance can be maintained by dispersing 10 to 80 percent by weight of titanium oxide in the reflective layer and adjusting the thickness of the reflective layer as appropriate. In order to adjust the viscosity of the medium of the reflective layer, fine particles of silicon oxide and/or aluminum oxide can also be dispersed in addition to titanium oxide.

Due to the presence of such a reflective layer 40, light, which is emitted from the semiconductor light-emitting element and travels toward the side surfaces, is incident on the reflective layer 40, and is reflected at an angle substantially corresponding to the incident angle.

The reflective layer 40 is provided on at least a part of each side surface of the sealant 38. It should be understood that the reflective layer 40 is preferably provided on the entire side surfaces. It is especially preferable that the reflective layer 40 be present along the entire height of the sealant 38 in order to prevent leakage of light from the side surfaces. In other words, the reflective layer 40 is present along the height direction of the sealant 38 so as to be flush with the light-emitting surface 36 that is a part of the sealant 38.

The reflective layer 40 is in contact with both the sealant 38 and the submount 21. Since the reflective layer 40 is in contact also with the submount 21, the reflective layer 40 covers the entire side surfaces of the sealant 38.

The boundary surface between the reflective layer 40 and the sealant 38 is a reflective surface 41. The relation of the reflective surface 41 to a surface 19 of the submount 21 is not specifically limited. However, it is desirable that the reflective surface 41 be perpendicular to, or at an obtuse angle to the surface 19, since the reflective surface 41 tends more to reflect light toward the light-emitting surface 36.

Figure 2:
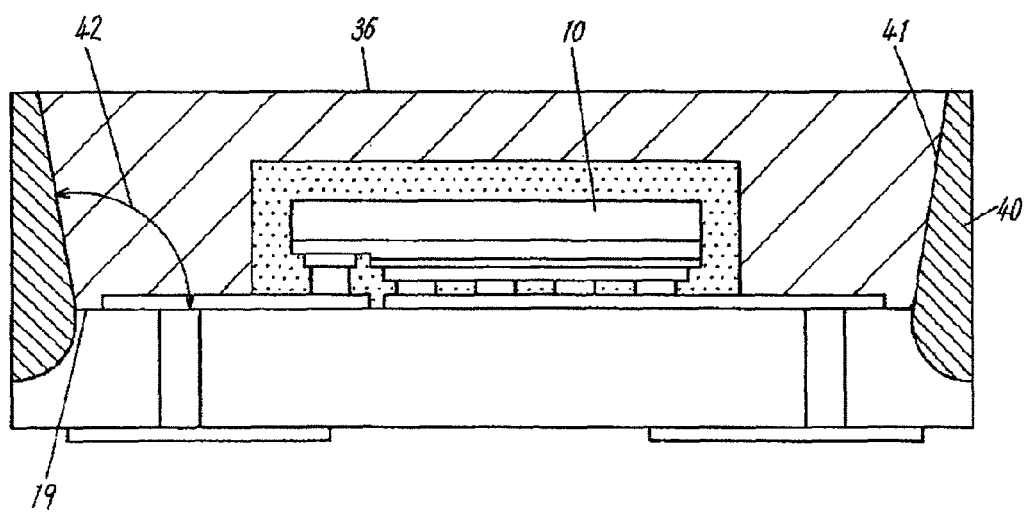
[FIG. 2]

FIG. 2 is a cross-sectional view of the semiconductor light-emitting device in which the reflective surface 41 is at an obtuse angle 42 to the surface 19 of the submount 21. If the reflective surface 41 is at such an angle as shown in FIG. 2 with respect to the surface of the submount, a larger amount of light from the semiconductor light-emitting element 10 is reflected toward the light-emitting surface 36, whereby luminous efficiency is increased.

Note that an element other than the semiconductor light-emitting element may be placed on the submount. For example, if the submount is made of a ceramic material such as aluminum nitride, a protection element such as, e.g., a diode, a resistor, or a protection circuit may be placed on the submount.

The submount and the semiconductor light-emitting element will be described in detail below.

A silicon zener diode, a silicon diode, silicon, aluminum nitride, aluminum oxide, other ceramic material, or the like can be used as the submount 21.

The through holes are through holes formed in the submount, and contain a conductive material such as copper, aluminum, or gold. The back electrodes 28, 29 are electrically coupled to the through holes, and are made of a conductive material such as copper, silver, or gold. The extended electrodes are made of a conductive material such as copper, aluminum, gold, or silver.

The bumps serve to fix the semiconductor light-emitting element 10 to the submount 21, and to electrically couple the extended electrodes 22, 23.

Although gold, gold-tin, solder, an indium alloy, a conductive polymer, or the like can be used as a material of the bumps, gold or a material mainly containing gold is especially preferred. With these materials, the bumps can be formed by a plating method, a vacuum deposition method, a screen printing method, a droplet injection method, a wire bump method, or the like.

For example, in the wire bump method, gold bumps are formed by producing gold wires, bonding one ends of gold wires to the extended electrodes on the submount by a bonder, and cutting the wires. In the droplet injection method, a volatile solvent, having dispersed therein fine nanoparticles of a highly conductive material such as gold, is printed by a method similar to an inkjet printing method, and the solvent is volatilized and removed to form bumps as aggregations of the nanoparticles.

Figure 3:
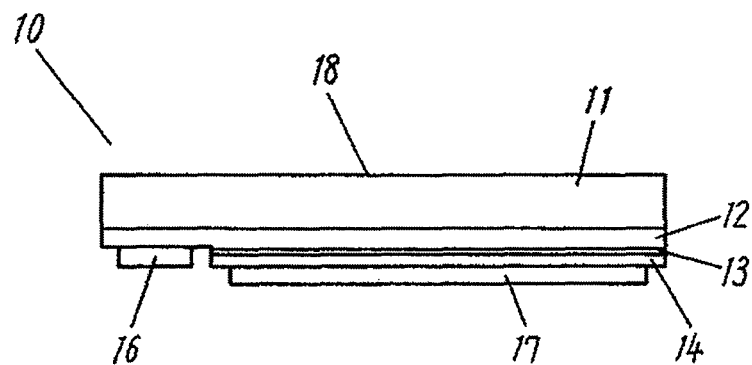
[FIG. 3]
Figure 4:
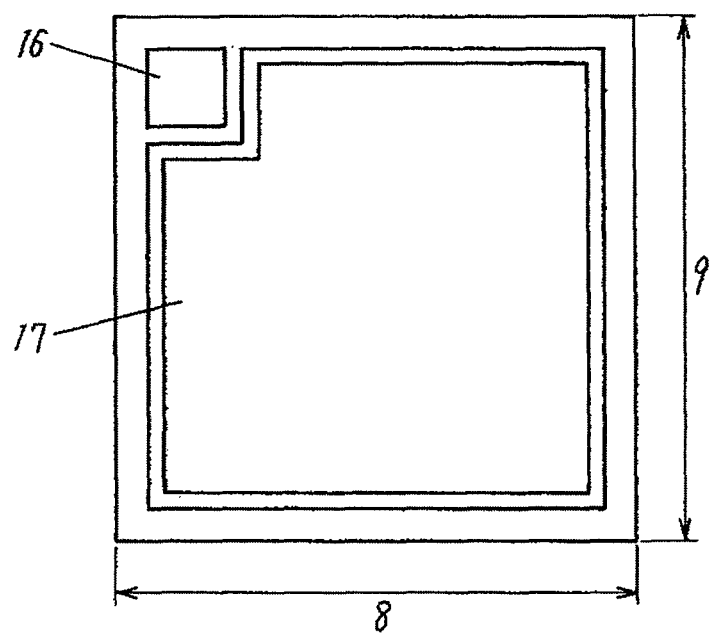
[FIG. 4]

FIG. 3 is a cross-sectional view of the semiconductor light-emitting element 10, and FIG. 4 is a plan view thereof as viewed from above the substrate. The semiconductor light-emitting element 10 is formed by a substrate 11, an n-type layer 12, an active layer 13, a p-type layer 14, an n-side electrode 16, and a p-side electrode 17.

The substrate 11 serves to hold a light-emitting layer. An insulating sapphire substrate can be used as the substrate 11. However, since gallium nitride (GaN) is used as a base material of a light-emitting portion, it is preferable to use as the substrate 11 a substrate having about the same refractive index as that of the light-emitting layer, such as GaN, SiC, AlGaN, or AlN, in order to reduce reflection of light at the interface between the n-type layer 12 and the substrate 11.

The n-type layer 12, the active layer 13, and the p-type layer 14 of the light-emitting layer are sequentially laminated on the substrate 11. Although the materials of the n-type layer 12, the active layer 13, and the p-type layer 14 are not specifically limited, each of the n-type layer 12, the active layer 13, and the p-type layer 14 is preferably made of a GaN compound. More specifically, the n-type layer 12, the active layer 13, and the p-type layer 14 are preferably made of GaN, InGaN, and GaN, respectively. Note that AlGaN or InGaN may be used as the n-type layer 12 and the p-type layer 14. A GaN or InGaN buffer layer may further be provided between the n-type layer 12 and the substrate 11. For example, the active layer 13 may have a multilayer structure (a quantum well structure) in which InGaN and GaN layers are alternately laminated.

In the n-type layer 12, the active layer 13, and the p-type layer 14 laminated on the substrate 11, the active layer 13 and the p-type layer 14 are partially removed to expose the n-type layer 12. The n-side electrode 16 is formed on the exposed n-type layer 12. Note that in the case where the substrate 11 is made of a conductive material, the substrate 11 may be exposed to form the n-side electrode 16 directly on the substrate 11.

The p-side electrode 17 is also formed on the p-type layer 14. That is, the light-emitting layer, and the p-side electrode, and the n-side electrode can be formed on the same side of the substrate by removing the active layer 13 and the p-type layer 14 so as to expose the n-type layer 12.

The p-side electrode 17 is a first electrode made of a material having high reflectance, such as Ag, Al, or Rh, in order to reflect light emitted by the light-emitting layer toward the substrate 11. That is, the upper surface of the substrate 11 is a light-emitting surface 18. It is more desirable to provide between the p-type layer 14 and the p-side electrode 17 an electrode layer such as Pt, Ni, Co, or indium tin oxide (ITO) in order to reduce the ohmic contact resistance between the p-type layer 14 and the p-side electrode 17. Al, Ti, or the like can be used as the n-side electrode 16. It is desirable to form an Au or Al film on the surface of the p-side electrode 17 and the surface of the n-side electrode 16 in order to increase adhesion strength to the bumps. These electrodes can be formed by a vacuum deposition method, a sputtering method, or the like.

The size of the semiconductor light-emitting element 10 is not specifically limited. However, in order to emit a larger amount of light, it is more preferable that the semiconductor light-emitting element 10 have a larger total area. It is desirable that the size of the semiconductor light-emitting element 10 be at least 600 μm by 600 μm (sides 8 and 9). One side (8 or 9) of the semiconductor light-emitting element 10 may be longer than the other side. This is because applications of semiconductor light-emitting elements include mobile phones and mobile computers, and there is also a demand for rectangular light-emitting devices.

Note that although a flip-chip type semiconductor light-emitting element is described in detail above, any type of semiconductor light-emitting element may be used in the semiconductor light-emitting device of the present invention.

The phosphor layer 35 will be described below. The phosphor layer 35 is made of a transparent medium, such as a resin or glass, having particles of an inorganic or organic phosphor material dispersed therein.

For example, in the case where the semiconductor light-emitting element 10 emits blue light, and the semiconductor light-emitting device 1 emits white light, the phosphor layer 35 is a phosphor that receives blue light from the semiconductor light-emitting element 10, and converts the wavelength of the blue light to emit yellow light. A rare-earth doped nitride or rare-earth doped oxide phosphor is preferable as such a phosphor material. More specifically, a rare-earth doped alkaline earth metal sulfide, a rare-earth doped garnet such as $(Y.Sm)_3(Al.Ga)_5O_{12}$:Ce or $(Y_{0.39}Gd_{0.57}Ce_{0.03}SM_{0.01})_3Al_5O_{12}$, a rare-earth doped alkaline earth metal ortho silicate, a rare-earth doped thiogallate, a rare-earth doped aluminate, or the like can be preferably used as such a phosphor material. Alternatively, a silicate phosphor $(Sr_{1-a1-b2-x}Ba_{a1}Ca_{b2}Eu_x)_2SiO_4$ or alpha sialon (α-sialon:Eu) $Mx(Si,Al)_{12}(O,N)_{16}$ may be used as a phosphor material that emits yellow light.

The medium described above regarding the sealant may be used as the medium of the phosphor layer 35. For example, a resin mainly containing a silicone resin, a resin mainly containing an epoxy resin, a resin mainly containing a fluororesin, or a glass material that is produced by a sol-gel method can be used as the medium of the phosphor layer 35. Some of such glass materials have a hardening temperature of about 200° C., and thus can be said to be preferred materials even in view of the heat resistance of materials that are used for the bumps and the parts of the electrodes. A mixture of the phosphor and the medium is called a phosphor paint.

FIGS. 5A-5B illustrate a manufacturing method of the semiconductor light-emitting device of the present invention. Extended electrodes 22, 23 are formed on a submount substrate 210 that serves as submounts 21. Through holes and back electrodes are also formed as needed. Bumps 24, 25 are formed on the extended electrodes 22, 23. Then, semiconductor light-emitting elements 10 are welded to the submount substrate 210 (FIG. 5A).

A plurality of semiconductor light-emitting elements are formed on the submount substrate 210. In this manner, a large number of semiconductor light-emitting devices can be produced at a time.

Then, phosphor layers 35 are formed. The phosphor layers 35 are formed by applying a phosphor paint to the semiconductor light-emitting elements 10. Although a method for forming the phosphor layers 35 is not specifically limited, applying a phosphor paint by a printing method is quick and simple (FIG. 5B).

Figure 6A:
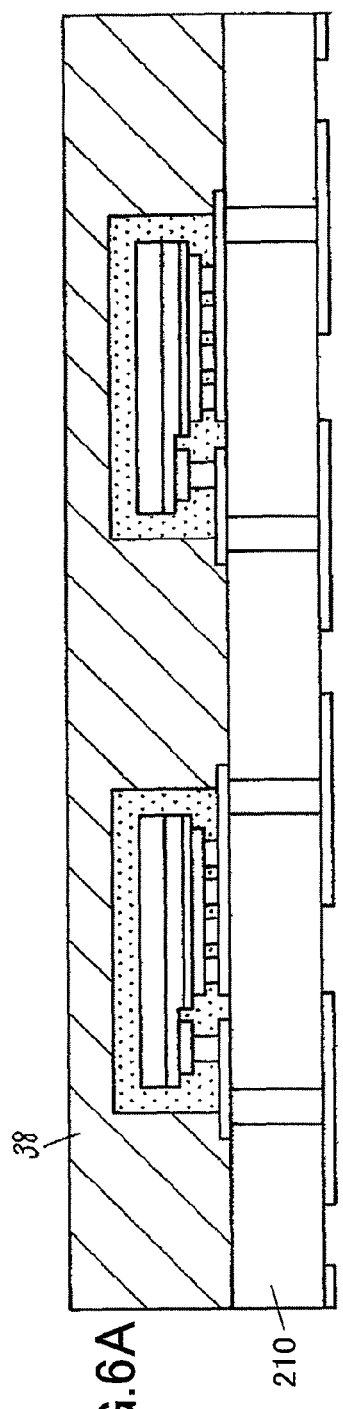
FIGS. 6A, 6B, and 6C are diagrams illustrating the manufacturing method of the semiconductor light-emitting device of the present invention.
Figure 6B:
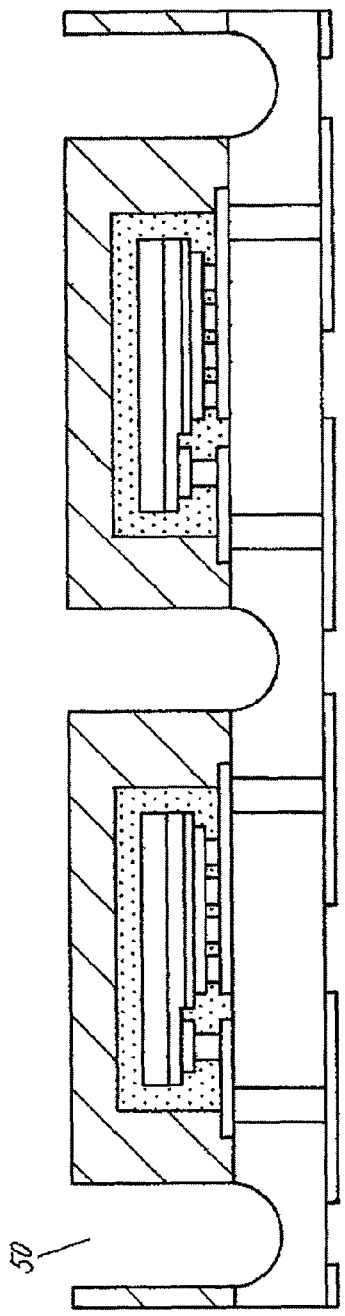
Figure 6C:
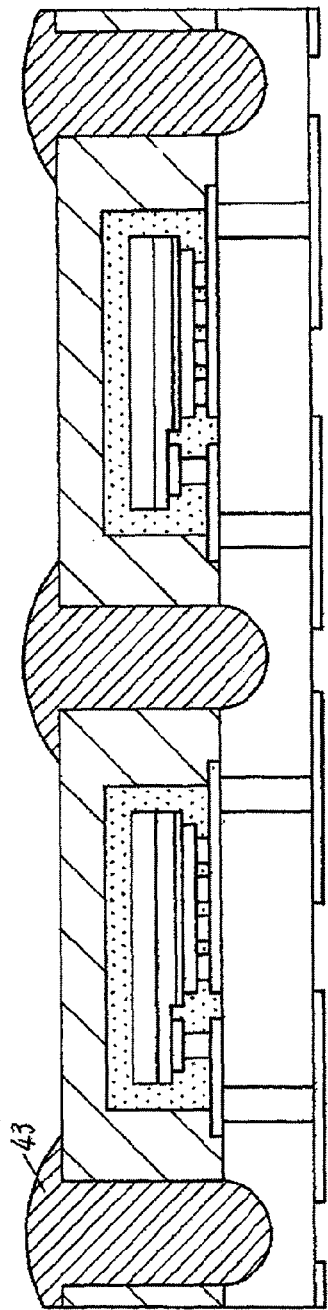

The subsequent steps are shown in FIGS. 6A-6C. After the phosphor layers are formed, a sealant 38 is formed over the entire surface of the submount substrate 210 (FIG. 6A). An example using a resin as the sealant will be described below. A method for forming the sealant is not specifically limited. Applying and drying a liquefied sealing resin with a solvent enables the sealing resin to be applied quickly with high thickness accuracy. Note that the phosphor layer need not necessarily be formed since in some cases, the color of light emitted from the semiconductor light-emitting element is used as it is.

Then, a process of forming a groove between the semiconductor light-emitting elements is performed (FIG. 6B). Grooves 50 formed by this process serve as spaces to be filled with a reflective material. A dicing machine or the like can be preferably used for the groove formation process. Reflective surfaces, which are perpendicular to the submount surface, can be formed by performing the groove formation process with the submount substrate 210 being held horizontally. Note that reflective surfaces, which are tilted with respect to the submount substrate 210, can also be formed by performing the groove formation process with the submount substrate 210 being tilted with respect to the dicing machine.

For example, in FIG. 6A, the submount substrate 210 is tilted to the left (so that the right side is higher than the left side), and a groove is formed in a region located on the left side of each semiconductor light-emitting element. Then, the submount substrate 210 is tilted to the right, and a groove is formed in a region located on the right side of each semiconductor light-emitting element. Thus, reflective surfaces that are at an obtuse angle to the submount surface can be formed. The semiconductor light-emitting device of FIG. 2 is fabricated in this manner.

It is preferable that the grooves 50 extends through the sealant to a depth in the submount substrate 210, in order to reliably cover the side surface portions of the sealant with the reflective material. The groove formation process is performed on the four sides of the semiconductor light-emitting element in order to form a reflective surface on the four side surfaces of the sealant. However, in the case where no reflective surface is intentionally formed on one or more side surfaces of the sealant for any reason, the groove formation process need not be performed on these side surfaces.

When the groove formation process is finished, the grooves 50 are filled with a reflective material 43 (FIG. 6C). Note that the reflective material 43 forms reflective layers 40 after being hardened. A method for filling the grooves 50 with the reflective material 43 is not specifically limited. As an example, the reflective material 43 may be uniformly applied to the upper surface of the sealant. Alternatively, the grooves 50 may be filled with the reflective material 43 by a method such as a dropping method, a printing method, a spray method, or a spin coating method.

Figures 7A, 7B:
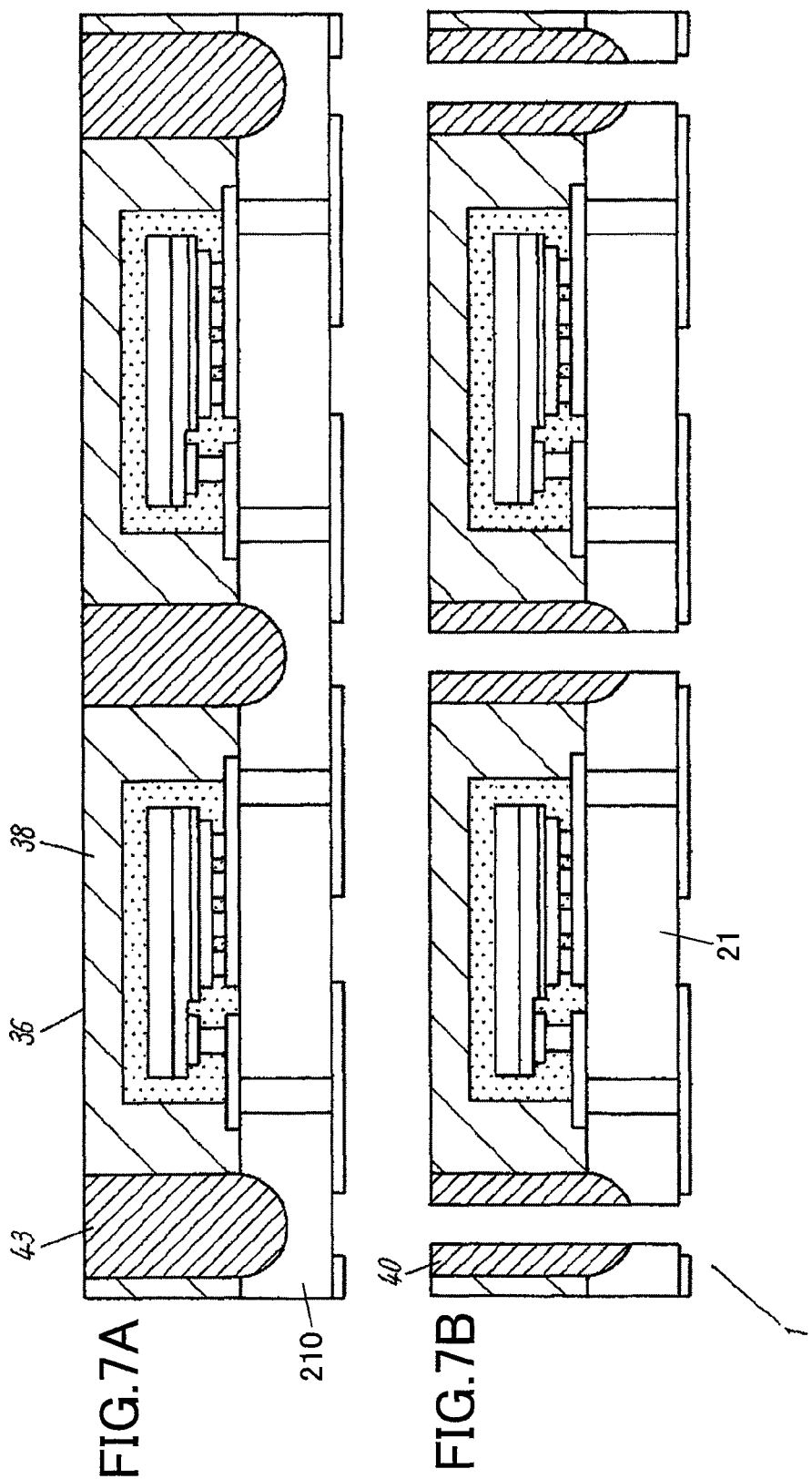
FIGS. 7A and 7B are diagrams illustrating the manufacturing method of the semiconductor light-emitting device of the present invention.

FIGS. 7A-7B show the subsequent steps. After the grooves 50 are filled with the reflective material 43, the upper surface of the sealant 38 is polished (FIG. 7A). Since the upper surface of the sealant is polished after filling the grooves 50 with the reflective material 43, the surfaces of the reflective layers are flush with light-emitting surfaces 36. Although a polishing method is not specifically limited, a Lapmaster polishing apparatus or the like can be preferably used. The polishing process need not necessarily be performed at a time, and may be performed while sequentially changing the abrasive grain size.

Figure 8:
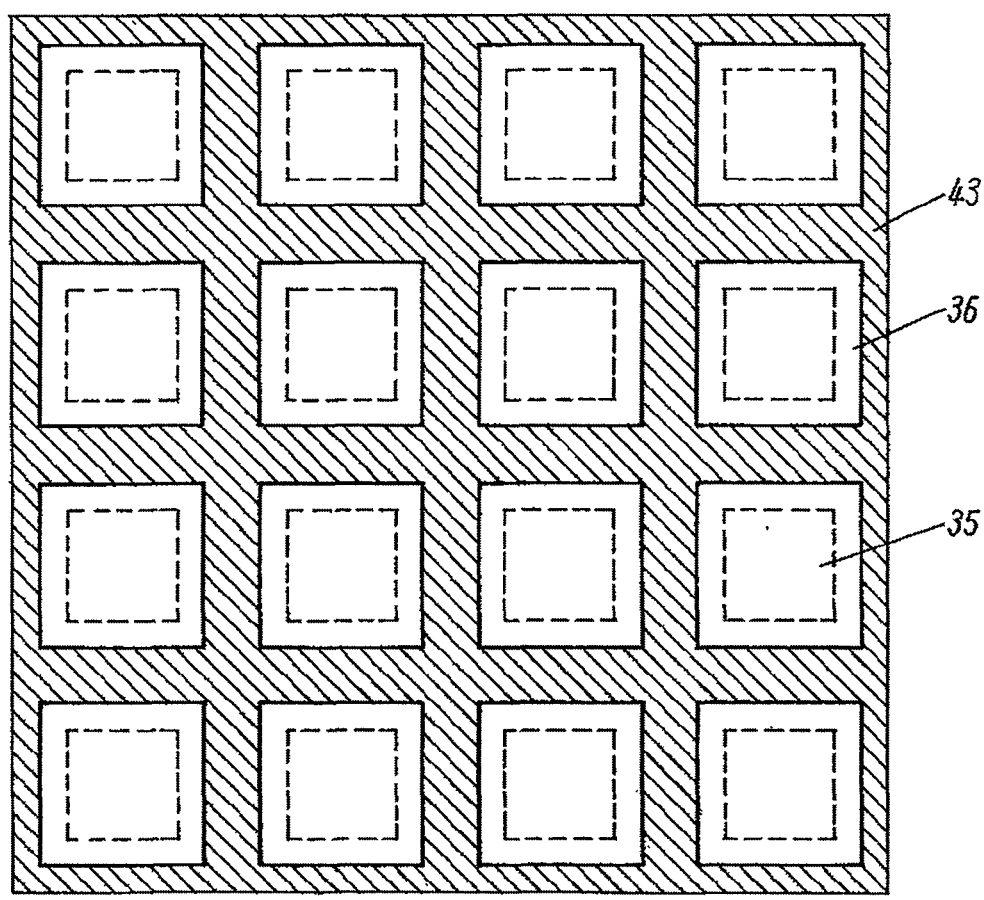
[FIG. 8]

FIG. 8 shows a state as viewed from the light-emitting surface side. The semiconductor light-emitting devices are arranged at regular intervals in a matrix pattern on the submount substrate 210. The light-emitting surfaces 36 can be seen, and dashed squares represent the fluorescent material layers 35. The gaps between the semiconductor light-emitting devices are filled with the reflective material 43. Thus, the semiconductor light-emitting device of the present invention is capable of surface emission.

Referring back to FIGS. 7A-7B, the submount substrate 210 is then cut along the lines extending in the middle of the reflective material 43, into individual semiconductor light-emitting devices 1 (FIG. 7B).

(Second Embodiment)

In the first embodiment, as shown in FIGS. 6A-6B, the sealant 38 is formed over the entire surface of the submount substrate 210 having the semiconductor light-emitting elements placed thereon, and then the groove formation process is performed. This method is capable of processing a large number of substrates in a short time. However, since the sealant is formed over the entire surface of the submount substrate 210, the submount substrate 210 can be subjected to increased stress when the sealant is cured. Excessive stress can bend the submount substrate, or can fracture or crack the portion where the sealant is formed. Thus, the sealant may be formed over each semiconductor light-emitting element.

FIGS. 9A-9B illustrate a part of a manufacturing method of a semiconductor light-emitting device of the present invention. FIG. 9A is a diagram corresponding to FIG. 6A, and FIG. 9B is the same as FIG. 6B. The manufacturing method of the present embodiment can be exactly the same as that of the first embodiment except for a method for forming a sealant shown in FIG. 9A.

In the present embodiment, a sealant is formed over each semiconductor light-emitting element after phosphor layers 35 are formed. Alternatively, the sealant may be continuously formed only in the column direction or the row direction in the arrangement of the semiconductor light-emitting elements shown in FIG. 8. The stress, which is applied to the submount substrate when the resin is cured, can be reduced if the sealant is not formed over the entire surface of the submount substrate at a time.

The manufacturing method of the present embodiment can produce the same semiconductor light-emitting device as that produced in the first embodiment.

(Third Embodiment)

A manufacturing method capable of reducing the number of steps will be described in the present embodiment.

Figure 10A:
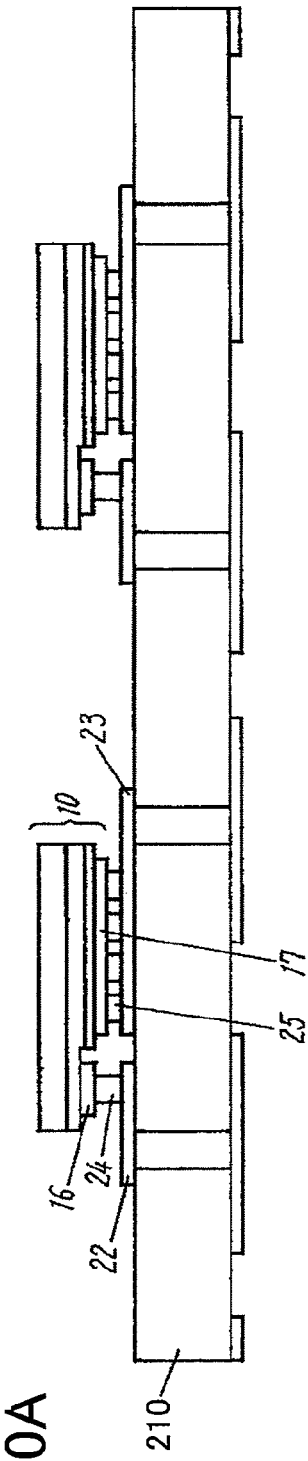
FIGS. 10A, 10B, and 10C are diagrams illustrating still another manufacturing method of the semiconductor light-emitting device of the present invention.
Figure 10B:
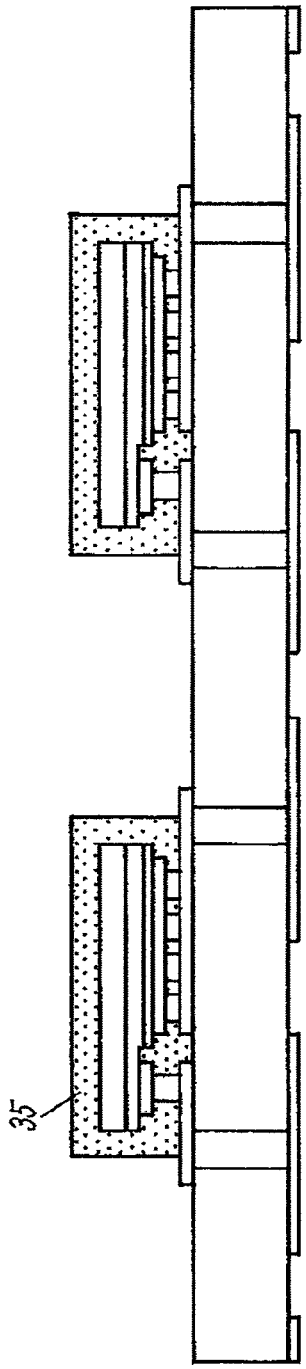
Figure 10C:
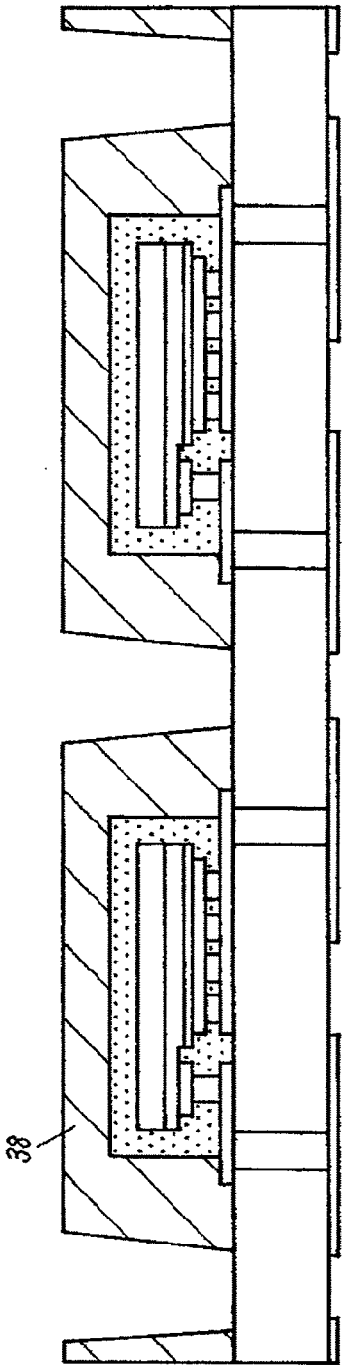

Referring to FIGS. 10A-10C, extended electrodes 22, 23 are formed on a submount substrate 210, bumps 24, 25 are also formed, and semiconductor light-emitting elements 10 are placed thereon (FIG. 10A). A phosphor layer 35 is also formed around each semiconductor light-emitting element 10 (FIG. 10B). These steps are the same as those of the first embodiment.

Then, a sealant 38 is formed over each semiconductor light-emitting element (FIG. 10C). Although a method of forming the sealant 38 is not limited, the use of a printing method or the like is convenient and quick.

Figure 11A:
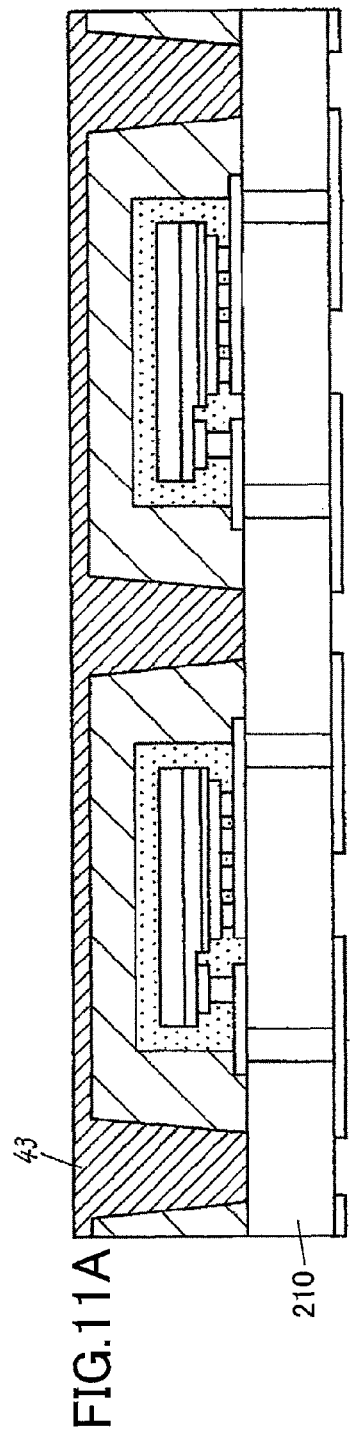
FIGS. 11A, 11B, and 11C are diagrams illustrating the still another manufacturing method of the semiconductor light-emitting device of the present invention.
Figure 11B:
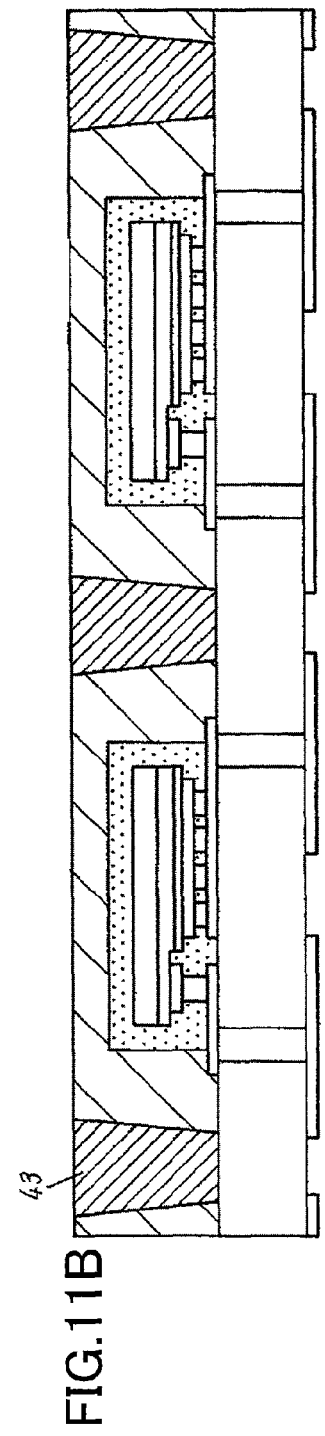
Figure 11C:
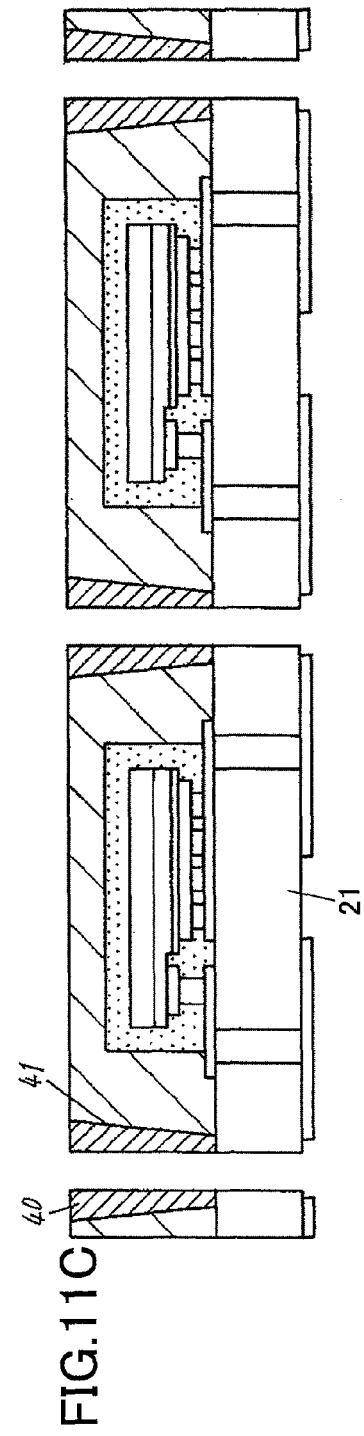

FIGS. 11A-11C show the subsequent steps. After the sealant is formed, a reflective material 43 is applied and formed over the entire surface of the submount substrate 210 (FIG. 11A). No groove formation process is performed in the present embodiment.

Surfaces, which serve as light-emitting surfaces 36, are formed by a polishing method (FIG. 11B). The result similar to that of FIG. 8 is obtained by this polishing method. Then, the submount substrate 210 is cut along the portions filled with the reflective material 43 (FIG. 11C). A semiconductor light-emitting device having a reflective layer formed on its side surfaces can be obtained by these steps.

In the manufacturing method of the semiconductor light-emitting device shown in the present embodiment, the groove formation process can be omitted, whereby the semiconductor light-emitting device can be fabricated more quickly. It should be noted that the reflective surfaces 41 reflect the shape of the sealant, which is formed upon formation of the sealant. Thus, the angle between the submount 21 and the reflective surface can be less than a right angle.

(Fourth Embodiment)

Figure 12:
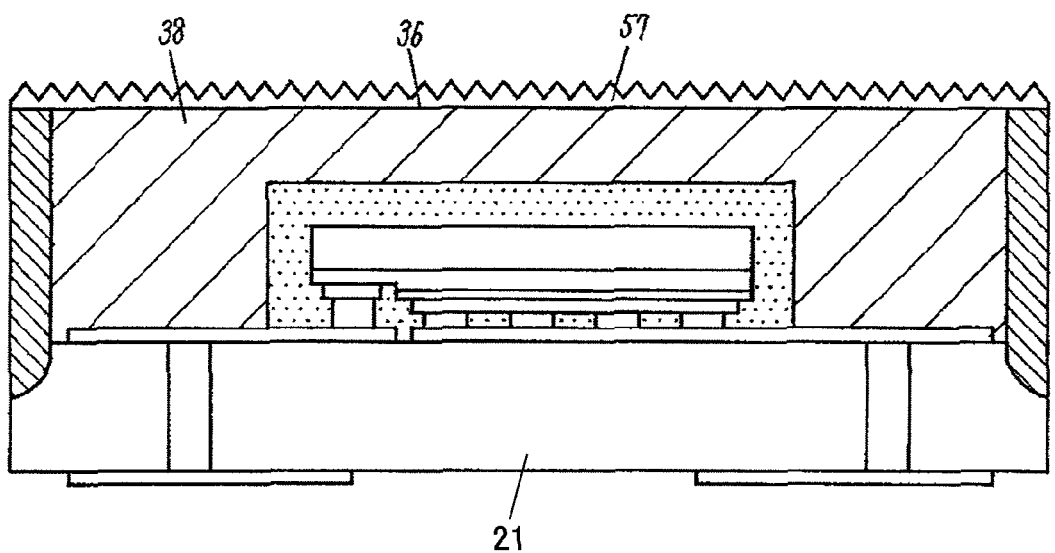
[FIG. 12]

FIG. 12 shows a semiconductor light-emitting device of the present embodiment. In the present embodiment, an antireflection-treated light-emitting surface 57 is formed on a light-emitting surface 36. The antireflection treatment prevents total reflection of light that travels in a sealant 38 and is incident on the light-emitting surface at a shallow angle, thereby increasing light extraction efficiency from the semiconductor light-emitting device.

Figures 13A, 13B:
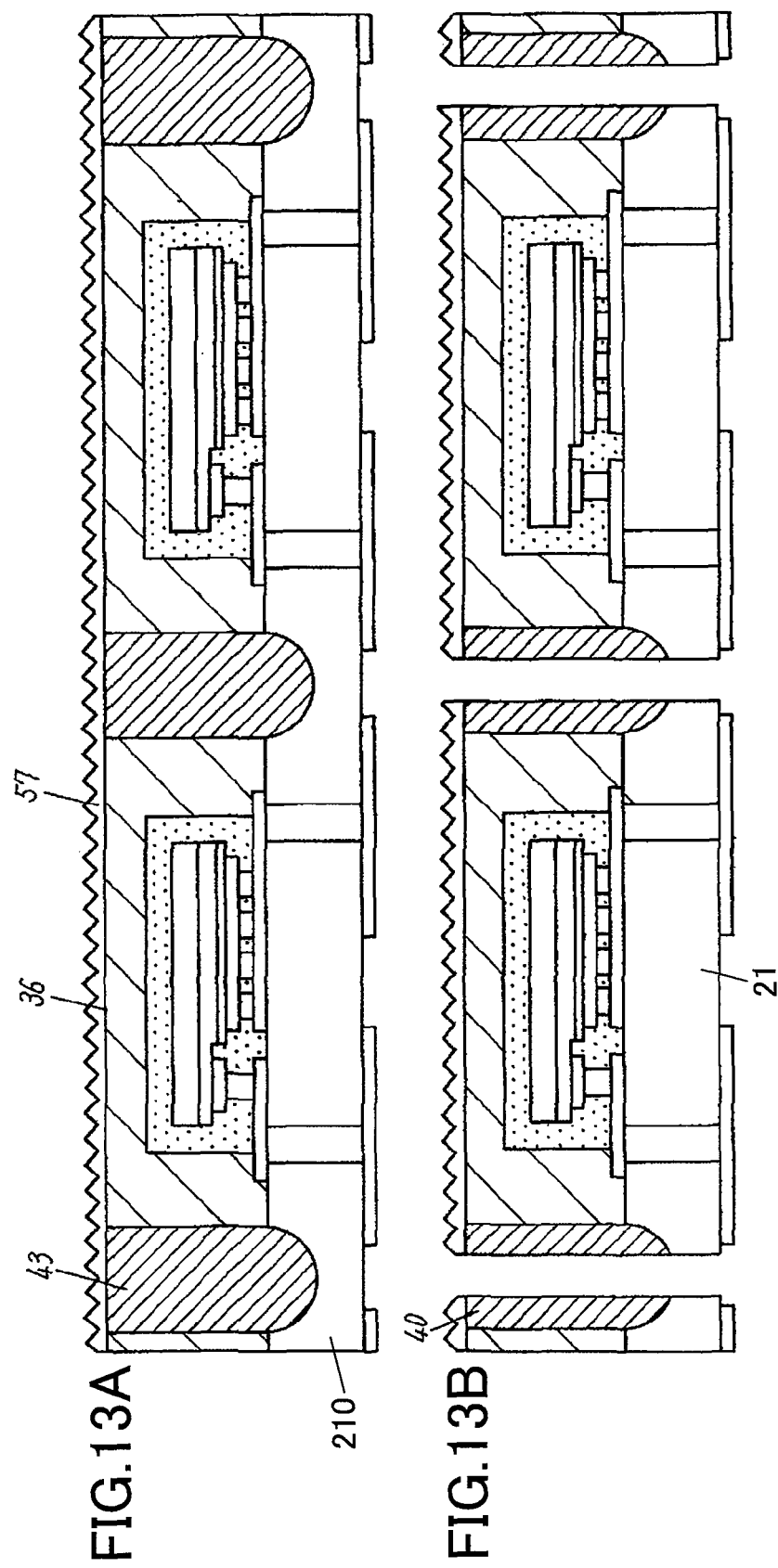
FIGS. 13A and 13B are diagrams illustrating a manufacturing method of the semiconductor light-emitting device of the present invention shown in FIG. 12.
Figure 14:
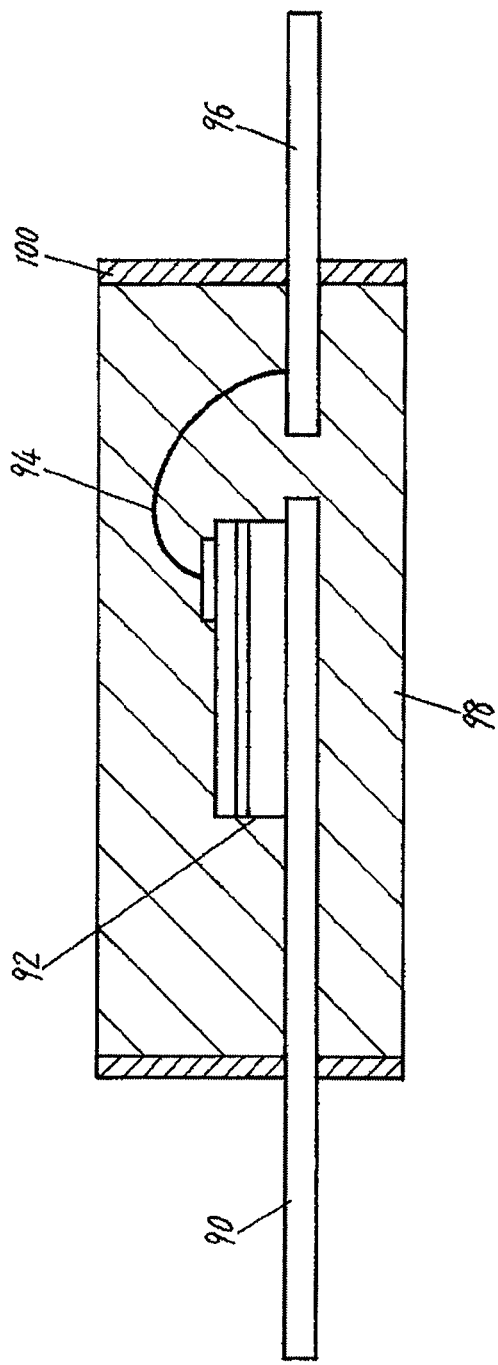
FIG. 14 is a cross-sectional view of a conventional semiconductor light-emitting device.

FIGS. 13A-13B illustrate a manufacturing method of the semiconductor light-emitting device. After semiconductor light-emitting elements are placed on a submount substrate 210, and phosphor layers 35 are formed, the semiconductor light-emitting elements are sealed with a sealant. Then, a groove formation process is performed, and grooves formed by this process are filled with a reflective material 43. Subsequently, a light-emitting surface 36 is polished. These steps are the same as those shown in FIG. 7A in the first embodiment.

In the manufacturing method of the present embodiment, after these steps, the antireflection-treated light-emitting surface 57 having a fine concavo-convex structure is formed on the entire light-emitting surface 36 (FIG. 13A). The fine concave-convex structure prevents total reflection at the light-emitting surface, thereby increasing the light extraction efficiency. The antireflection-treated light-emitting surface 57 is formed on the entire light-emitting surface 36 as it is complicated to form the antireflection-treated light-emitting surface 57 over each semiconductor light-emitting element.

A fine concavo-convex structure having a fine pattern approximately corresponding to the wavelength of light, or a pattern finer than the wavelength of light depending on the wavelength used, can be formed by a microfabrication process using a nano-imprint technique. The fine concavo-convex structures of various shapes, such as a groove shape, a spindle shape, and a hemispherical shape, can be formed by the nano-imprint technique. Note that the nano-imprint technique needs to be performed on a flat surface. Since the ground surface formed by the light-emitting surfaces 36 and the reflective material 43 is very flat, a fine pattern can be formed accurately. In the nano-imprint technique, a thin layer of a liquid resin is applied to the light-emitting surfaces 36, a mold is pressed against the resin layer, and the resin layer is cured by heat or ultraviolet (UV) radiation. Thus, a concavo-convex pattern formed on the mold surface is transferred to the resin layer.

In the case where the light-emitting surfaces 36 are formed by an inorganic sealant, a polymer resist such as polymethyl methacrylate (PMMA) is applied to the light-emitting surfaces 36, and a fine resist pattern is formed by a nano-imprint method or the like. By using the fine resist pattern as a mask, an etching process is performed with a gas such as $CF_4$ to form concaves and convexes on the light-emitting surfaces 36. Forming the concavo-convex shape on the surface by etching is a simple process, and increases the light extraction effect. However, this process is characterized in that it is difficult to accurately control the concavo-convex shape, and it is impossible to form exactly the same concavo-convex shape on many substrate surfaces.

Alternatively, the abrasive grain size that is used at the end of the polishing step (FIG. 7A) may be adjusted so that the surface roughness of the ground surface is within a certain range, and this ground surface may be used as a concavo-convex structure on the substrate surface.

Alternatively, a concavo-convex structure may be formed on the substrate surface by an inkjet printing method. This method can be performed in a convenient manner since the method does not include the step of etching the substrate. The light extraction effect can be produced by adjusting the refractive index of the concavo-convex structure to be formed. After a fine concavo-convex structure is formed on the light-emitting surfaces 36, the submount substrate is cut along the reflective material 43, whereby semiconductor light-emitting devices of the present embodiment are obtained (FIG. 13B).

Note that the light extraction efficiency can be decreased by total reflection due to the refractive index at the boundary surface. Such a decrease in light extraction efficiency is a problem that can occur not only at the interface between the light-emitting surface 36 and the atmosphere, but also at the interface between the light-emitting surface 18 of the semiconductor light-emitting element and the phosphor layer 35, and at the interface between the phosphor layer 35 and the sealant 38. Thus, an antireflection treatment may be performed on the light-emitting surface 18 of the semiconductor light-emitting element, and/or the light-emitting surface of the fluorescent material layer.

Note that throughout the specification, Cl represents chlorine, F represents fluorine, Br represents bromine, I represents iodine, Al represents aluminum, Ga represents gallium, Si represents silicon, In represents indium, N represents nitrogen, O represents oxygen, Ag represents silver, Rh represents rhodium, Pt represents platinum, Ni represents nickel, Co represents cobalt, Ti represents titanium, Au represents gold, Y represents yttrium, Sm represents samarium, Ce represents cerium, Gd represents gadolinium, Sr represents strontium, Ba represents barium, Ca represents calcium, and Eu represents europium.

Industrial Applicability

The present invention can be used for semiconductor light-emitting devices in which a reflective layer is formed on the side surfaces of a sealant to increase luminous efficiency.

The invention claimed is:

1. A semiconductor light-emitting device, comprising:
a semiconductor light-emitting element;
a submount for placing the semiconductor light-emitting element thereon and having a mounting surface for placing the semiconductor light-emitting element thereon;
a sealant for sealing the semiconductor light-emitting element over the submount; and
a reflective layer provided on a side surface of the sealant, provided that a light-emitting surface of the sealant is an upper surface, wherein:
the submount is a flat plate on a center part of which the semiconductor light-emitting element is mounted, and includes, in at least part of a side wall of the flat plate, a step part in which a surface of the flat plate opposite to the mounting surface outwardly protrudes beyond the mounting surface, and
part of the reflective layer contacts the step part, and fully fills up the step part so as to be flush with an outermost side surface of the submount.

2. The semiconductor light-emitting device of claim 1, wherein
the sealant has a flat surface as the light-emitting surface.

3. The semiconductor light-emitting device of claim 2, wherein
the reflective layer is flush with the light-emitting surface, and is in contact with both the sealant and the submount.

4. The semiconductor light-emitting device of claim 1, wherein
a boundary surface between the sealant and the reflective layer is substantially perpendicular to a surface of the submount.

5. The semiconductor light-emitting device of claim 1, wherein
a boundary surface between the sealant and the reflective layer is at an obtuse angle to a surface of the submount.

6. The semiconductor light-emitting device of claim 1, further comprising:
a fine concavo-convex structure provided on the light-emitting surface.

7. The semiconductor light-emitting device of claim 1, further comprising:
a phosphor layer formed around the semiconductor light-emitting element.

* * * * *